(12) United States Patent
Song et al.

(10) Patent No.: US 11,699,754 B2
(45) Date of Patent: Jul. 11, 2023

(54) GATE STRUCTURE OF VERTICAL FET AND METHOD OF MANUFACTURING THE SAME

(71) Applicant: SAMSUNG ELECTRONICS CO., LTD., Suwon-si (KR)

(72) Inventors: Seung Hyun Song, Hwaseong-si (KR); Chang Woo Sohn, Seoul (KR); Young Chai Jung, Anyang-si (KR); Sa Hwan Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/563,608

(22) Filed: Dec. 28, 2021

(65) Prior Publication Data

US 2022/0123143 A1 Apr. 21, 2022

Related U.S. Application Data

(63) Continuation of application No. 16/828,049, filed on Mar. 24, 2020, now Pat. No. 11,233,146.

(Continued)

(51) Int. Cl.
*H01L 29/78* (2006.01)
*H01L 29/06* (2006.01)
(Continued)

(52) U.S. Cl.
CPC ...... *H01L 29/7827* (2013.01); *H01L 29/0653* (2013.01); *H01L 29/401* (2013.01); *H01L 29/42364* (2013.01); *H01L 29/42368* (2013.01); *H01L 29/513* (2013.01); *H01L 29/517* (2013.01); *H01L 29/518* (2013.01); *H01L 29/66666* (2013.01)

(58) Field of Classification Search
CPC ............. H01L 29/7827; H01L 29/0653; H01L 29/401; H01L 29/42364; H01L 29/42368; H01L 29/513; H01L 29/517; H01L 29/518; H01L 29/66666; H01L 29/4991; H01L 29/515; H01L 29/66795; H01L 29/785; H01L 29/42376; H01L 29/0847; H01L 29/1033; H01L 29/41741; H01L 29/516

See application file for complete search history.

(56) References Cited

U.S. PATENT DOCUMENTS 6,303,418 B1 10/2001 Cha et al.
9,536,793 B1 1/2017 Zhang et al.
(Continued)

*Primary Examiner* — Douglas W Owens
(74) *Attorney, Agent, or Firm* — Sughrue Mion, PLLC

(57) ABSTRACT

A vertical field-effect transistor (VFET) includes: a fin structure on a substrate; a gate structure including a gate dielectric layer on an upper portion of a sidewall of the fin structure, and a conductor layer on a lower portion of the gate dielectric layer; a top source/drain (S/D) region above the fin structure and the gate structure; a bottom S/D region below the fin structure and the gate structure; a top spacer on an upper portion of the gate dielectric layer, and between the top S/D region and a top surface of the conductor layer; and a bottom spacer between the gate structure and the bottom S/D region. A top surface of the gate dielectric layer is positioned at the same or substantially same height as or positioned lower than a top surface of the top spacer, and higher than the top surface of the conductor layer.

20 Claims, 12 Drawing Sheets

Related U.S. Application Data

(60) Provisional application No. 62/846,153, filed on May 10, 2019.

(51) Int. Cl.
*H01L 29/423* (2006.01)
*H01L 29/40* (2006.01)
*H01L 29/51* (2006.01)
*H01L 29/66* (2006.01)

(56) References Cited

U.S. PATENT DOCUMENTS

| | | | |
|---|---|---|---|
| 9,780,197 B1* | 10/2017 | Xie | H01L 21/28088 |
| 9,859,420 B1 | 1/2018 | Balakrishnan et al. | |
| 10,032,676 B1 | 7/2018 | Cheng et al. | |
| 10,199,464 B2 | 2/2019 | Cheng et al. | |
| 10,256,321 B2 | 4/2019 | Cheng et al. | |
| 2018/0315850 A1* | 11/2018 | Liu | H01L 29/165 |
| 2020/0144254 A1 | 5/2020 | Song et al. | |
| 2020/0411686 A1 | 12/2020 | Haratipour et al. | |

* cited by examiner

GATE STRUCTURE OF VERTICAL FET AND METHOD OF MANUFACTURING THE SAME

CROSS-REFERENCE TO THE RELATED APPLICATION

This is a continuation application of U.S. application Ser. No. 16/828,049 filed Mar. 24, 2020, which claims priority from U.S. Provisional Application No. 62/846,153 filed on May 10, 2019, in the U.S. Patent and Trademark Office, the disclosures of which are incorporated herein in their entirety by reference.

BACKGROUND

1. Field

Apparatuses consistent with exemplary embodiments of the inventive concept relate to a vertical field effect transistor (VFET).

2. Description of the Related Art

It is known that a VFET has advantages in scale over a conventional planar field effect transistor (FET) because a more reduced size of a semiconductor cell can be designed and manufactured.

As known, the VFET is characterized in that a vertical fin structure is formed above a substrate, and a top source/drain (S/D) region and a bottom S/D region are formed above and below the fin structure, respectively. Further, a gate structure is formed along sidewalls of the fin structure to surround the fin structure. Like in a planar FET, the gate structure of the VFET receiving an input signal to activate the VFET, and gate controllability thereof are factors to improve the entire VFET performance.

Accordingly, improved technologies and techniques for forming the gate structure of the VFET would be desirable.

SUMMARY

Various embodiments of the inventive concept are directed to a vertical field effect transistor (VFET) device and a method of manufacturing the VFET device.

These embodiments may provide VFET devices having improved performance of a gate structure and methods to achieve the improved VFET devices.

According to exemplary embodiments, there is provided a VFET device which may include: a fin structure formed on a substrate; a gate structure including a gate dielectric layer formed on an upper portion of a sidewall of the fin structure, and a conductor layer formed on a lower portion of the gate dielectric layer; a top source/drain (S/D) region formed above the fin structure and the gate structure; a bottom S/D region formed below the fin structure and the gate structure; a top spacer formed on an upper portion of the gate dielectric layer, and between the top S/D region and a top surface of the conductor layer; and a bottom spacer formed between the gate structure and the bottom S/D region. Top surface of the gate dielectric layer is positioned at the same or substantially same height as or positioned lower than a top surface of the top spacer, and higher than the top surface of the conductor layer.

According to exemplary embodiments, there is provided a VFET device which may include: a fin structure formed on a substrate; a gate structure including a gate dielectric layer formed on an upper portion of a sidewall of the fin structure, and a conductor layer formed on a lower portion of the gate dielectric layer; a top source/drain (S/D) region formed above the fin structure to cover the gate structure; a bottom S/D region formed below the fin structure and the gate structure; an interlayer formed outside the gate structure and the top S/D region; an air gap spacer formed between the top S/D region and a top surface of the conductor layer of the gate structure, and between the gate structure and the interlayer; and a bottom spacer formed between the gate structure and the bottom S/D region.

According to exemplary embodiments, there is provided a method of manufacturing a VFET device. The method may include: providing a stack of a bottoms S/D region, a fin structure, and a gate structure on a side wall of the fin structure, an interlayer on a sidewall of the gate structure, and a mask layer on the fin structure, the stack further including a bottom spacer on the bottom S/D region and below the gate structure and the interlayer, and the gate structure comprising a gate dielectric layer on the sidewall of the fin structure and a conductor layer on the gate dielectric layer; etching the stack from a top surface thereof to remove the gate dielectric layer and the conductor layer, by different depths from the top surface thereof, and the mask layer to leave an upper portion of the gate dielectric layer and the fin structure such that the upper portion of the gate dielectric layer is positioned above a plane where a top surface of the conductor layer is positioned; and forming a top S/D region on the top surface of the fin structure, the top surface of the gate structure and a sidewall of the interlayer.

BRIEF DESCRIPTION OF THE DRAWINGS

The above and other aspects of inventive concepts will become more apparent to those of ordinary skill in the art by describing in detail example embodiments thereof with reference to the accompanying drawings, in which.

DETAILED DESCRIPTION

Figure 1A:
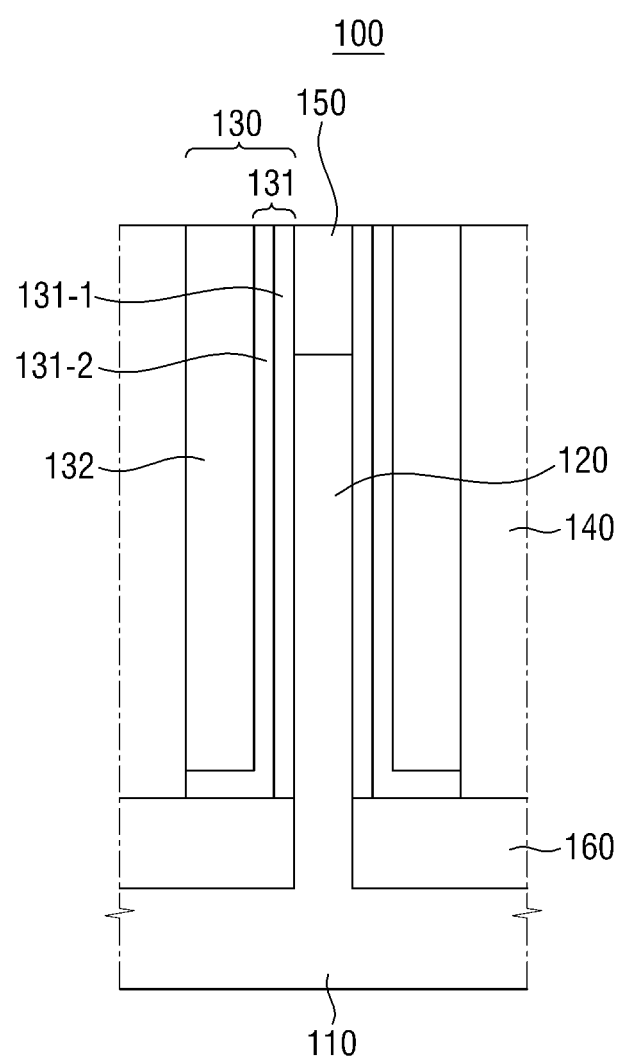
FIGS. 1A to 1C illustrate a process of manufacturing a VFET according to an exemplary embodiment.

Various embodiments of the inventive concept will be described more fully hereinafter with reference to the accompanying drawings. These embodiments are all exemplary, and may be embodied in many different forms and should not be construed as limiting the inventive concept. Rather, these embodiments are merely provided so that this disclosure will be thorough and complete, and will fully convey the inventive concept to those skilled in the art. In the drawings, the sizes and relative sizes of the various layers and regions may have been exaggerated for clarity, and thus, the drawings are not necessarily to scale, some features may be exaggerated to show details of particular components or elements. Therefore, specific structural and functional details disclosed herein are not to be interpreted as limiting, but merely as a representative basis for teaching one skilled in the art to variously employ the methods and structures of the embodiments.

An embodiment provided herein is not excluded from being associated with one or more features of another example or another embodiment also provided herein or not provided herein but consistent with the inventive concept. For example, even if matters described in a specific embodiment are not described in a different embodiment, the matters may be understood as being related to or combined with the different embodiment, unless otherwise mentioned in descriptions thereof.

For the purposes of the description hereinafter, the terms "upper", "lower", "top", "bottom", "left," and "right," and derivatives thereof can relate, based on context, to the disclosed structures, as they are oriented in the drawings. The same numbers in different drawings may refer to the same structural component or element thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof. Expressions such as "at least one of," when preceding a list of elements, modify the entire list of elements and do not modify the individual elements of the list.

As used herein, the term "surface" may refer to an end or an end point of a corresponding element, not being limited thereto a flat plane, and thus, the "surface" may indicate a non-flat area or point. For example, a "top (bottom) surface" may refer to a top (bottom) end or end point of a corresponding element.

Unless otherwise defined, all terms (including technical and scientific terms) used herein have the same meaning as commonly understood by one of ordinary skill in the art to which the embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
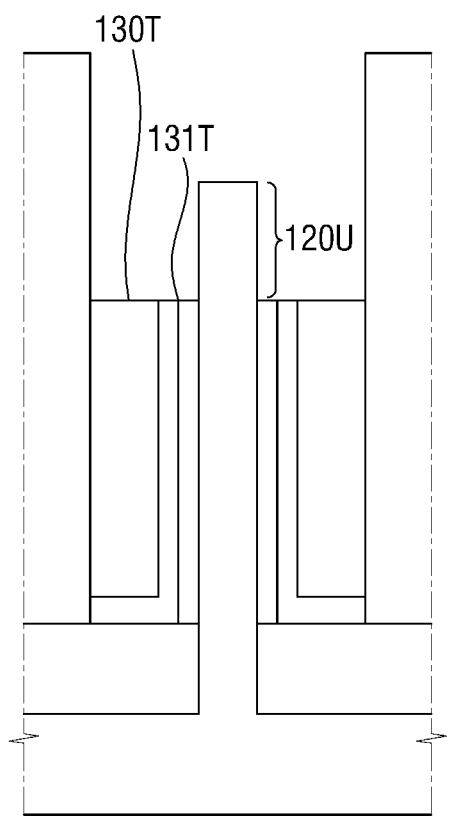
Figure 1C:
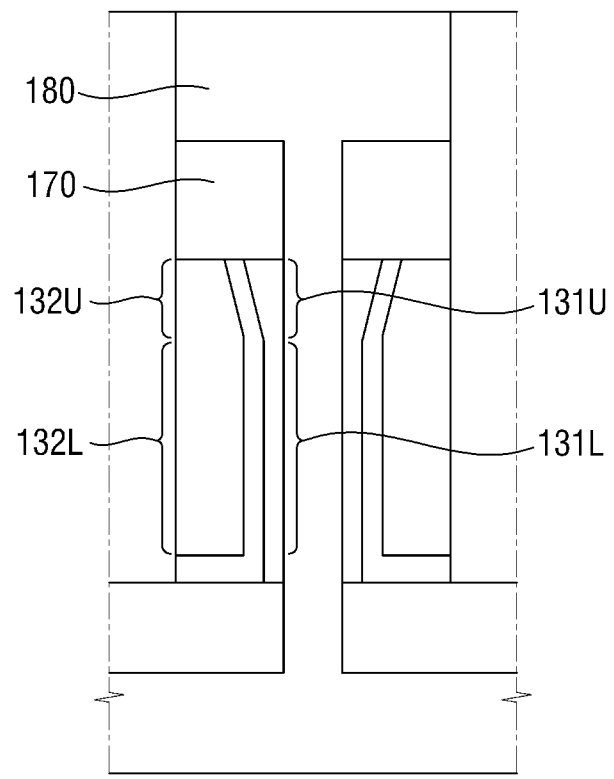

FIGS. 1A to 1C illustrate a process of manufacturing a VFET according to an exemplary embodiment.

First, a semiconductor stack 100 shown in FIG. 1A is provided for further processing to complete a VFET. According to an exemplary embodiment, the semiconductor stack 100 may be provided through a chemical-mechanical polishing (CMP) operation which includes chemical-mechanical planarization using chemical reactions. However, methods of providing the semiconductor stack 100 are not limited to a particular process such as the CMP operation.

The semiconductor stack 100 includes a bottoms S/D region 110 formed on a substrate (not shown), a fin structure 120 formed to become a channel of a VFET, and a gate structure 130 formed on a side wall of the fin structure 120. Here, the gate structure 130 may be conformally formed along a sidewall of the fin structure 120. The gate structure 130 includes at least a gate dielectric layer 131 and a conductor layer 132, and the gate dielectric layer 131 includes at least an interfacial layer 131-1 formed on the sidewall of the fin structure 120 and an high-κ dielectric layer 131-2 formed on the interfacial layer 131-1. The semiconductor stack 100 further includes an interlayer 140 formed on a sidewall of the gate structure 130, a mask layer 150 formed on the fin structure 120, and a bottom spacer 160 formed on the bottom S/D region 110 and below the gate structure 130 and the interlayer 140.

The fin structure 120 may be formed from a semiconductor epitaxy (or epitaxial layer) which is grown on a substrate (not shown) and formed of a material such as silicon (Si), germanium (Ge), silicon germanium (SiGe), and/or a silicon-containing material, not being limited thereto. The bottom S/D region 110 may be formed by doping the semiconductor epitaxy with one or more dopants such as boron (B) for a p-channel VFET and phosphorous (P) for n-channel VFET, not being limited thereto.

The interfacial layer 131-1 of the gate dielectric layer 131 may have been formed along the sidewall of the fin structure 120 applying at least one of chemical vapor deposition (CVD), plasma-enhanced CVD (PECVD) and atomic layer deposition (ALD) using at least one material selected from silicon oxide (SiO), silicon dioxide ($SiO_2$), and/or silicon nitride (SiON), not being limited thereto. The interfacial layer 131-1 may be provided for not only protecting the fin structure 120 but facilitating growth of the high-κ dielectric layer 131-2 thereon and providing a necessary characteristic interface with the fin structure 120.

The high-κ dielectric layer 131-2 may be formed of a metal oxide material or a metal silicate such as Hf, Al, Zr, La, Mg, Ba, Ti, Pb, or a combination thereof, not being limited thereto, having a dielectric constant value greater than 7. Preferably but not necessarily, the high-κ material may be $HfO_2$ and/or HfSiON, not being limited thereto, having a dielectric constant value greater than 15. The high-κ dielectric layer 131-2 may be provided to allow an increased gate capacitance without associated current leakage at the gate structure 130 in the VFET.

The conductor layer 132 may include a metal or metal compound such as Cu, Al, Ti, Ta, W, Co, TiN, WN, TiAl, TiAlN, TaN, TiC, TaC, TiAlC, TaCN, TaSiN, or a combination thereof, not being limited thereto.

One of parameters to affect the performance of the gate structure 130 may be the lateral thickness of the gate dielectric layer 131 formed along the sidewall of the fin structure 120. The smaller is the lateral thickness of the gate dielectric layer 131, the better performance may be had by the gate structure 130.

The interlayer 140 insulates the VFET from an outside conduction source, and may be formed of nitride, oxide, or a combination thereof, not being limited thereto. The mask layer 150 protects the fin structure 120 from an etching operation to be described in a next process of manufacturing the VFET. Photoresist or silicon nitride (SiN) may be used as masking material, not being limited thereto.

After providing the semiconductor stack 100 shown in FIG. 1A, the semiconductor stack 100 is applied an etching operation to remove the mask layer 150 and a given portion of the gate structure 130 from a top surface 130T thereof, thereby leaving only the fin structure 120 by a certain vertical length above a plane where a top surface 130T of the gate structure 130 is positioned between the interlayers 140 as shown in FIG. 1B. Thus, the fin structure 120 at an upper portion 120U takes a form of protrusion from the plane where the top surface 130T of the gate structure 130 is positioned between the interlayers 140.

According to an exemplary embodiment, the foregoing etching operation applied to the semiconductor stack 100 may include wet etching to selectively remove specific materials, that is, portions of the gate structure 130 as well as the mask layer 150 which may be formed of a nitride material such as silicon nitride (SiN), not being limited thereto.

After the etching operation described above, a top spacer 170 and a top S/D region 180 are formed to complete the VFET, as shown in FIG. 1C.

The top spacer 170 is formed above the gate structure 130 and between the fin structure 120 and the interlayers 140 by using at least one of CVD, PECVD and ALD, not being limited thereto. The top spacer 170 and the bottom spacer 160 may be formed of a material of at least one of silicon oxide ($SiO_2$), silicon nitride (SiN), and any low-κ materials such as SiCOH or SiBCN having a dielectric constant value less than 3.5, not being limited thereto. The top spacer 170 and the bottom spacer 160 may be formed of the same or different materials(s), and may serve to electrically isolate the gate structure 130 from the top S/D region 180 and the bottom S/D region 110, respectively.

The top S/D region 180 is formed at a position above the fin structure 120 and the top spacer 170 and between the interlayers 140. To form the top S/D region 180, a semiconductor epitaxy may be grown on the top surface 120T of the protruded fin structure 120, and then, the semiconductor epitaxy may be doped with one or more dopants such as boron (B) for a p-channel VFET and phosphorous (P) for n-channel VFET, not being limited thereto.

In this embodiment, however, as shown in FIG. 1C, an upper portion 131U of the gate dielectric layer 131 became thicker and the conductor layer 132 became thinner in a lateral direction from the sidewall of the fin structure 120. That is, the equivalent oxide thickness (EOT) of the gate dielectric layer 131 increases at the upper portion 131U. Thus, the gate dielectric layer 131 is thicker at the upper portion 131U than a lower portion 131L, and the conductor layer 132 is thinner at an upper portion 132U than a lower portion 132L. The inventors of this application identified that this increase of the EOT may be caused because at least the interfacial layer 131 formed of the oxide material such as silicon oxide (SiO), silicon dioxide ($SiO_2$), and/or silicon nitride (SiON) is exposed to air during the follow-on operations to form the VFET, thereby to cause oxidation or reoxidation on a top surface 131T of the gate dielectric layer 131 including the interfacial layer 131-1. The inventors also learned that the increase of the EOT at the gate dielectric layer 131 adversely affects the performance of the gate structure 130.

Accordingly, new embodiments are provided in reference to FIGS. 2A to 2C and 3A to 3C.

Figure 2A:
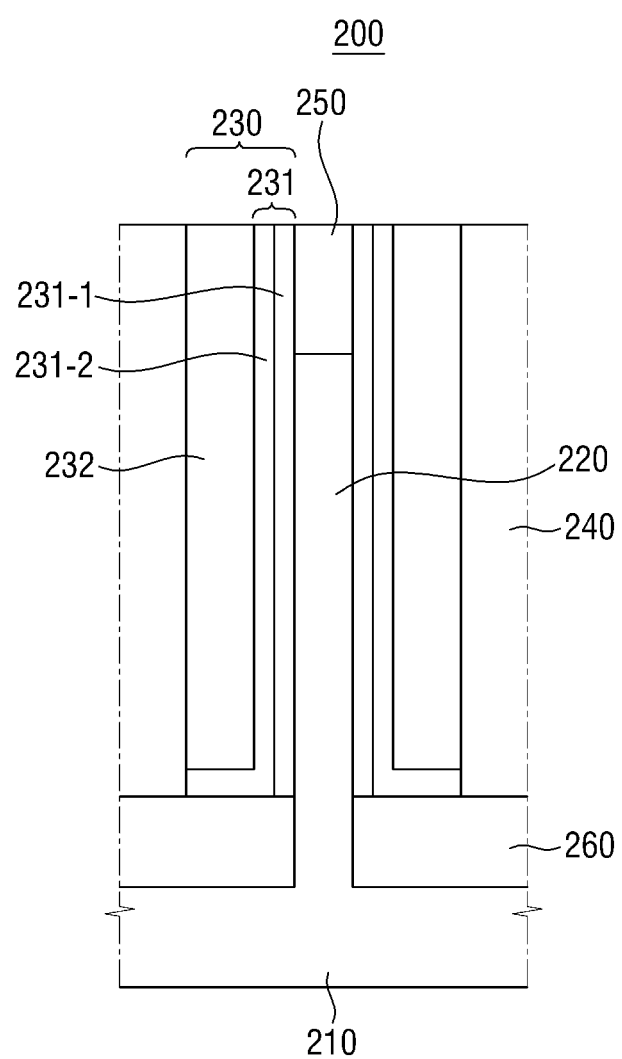
FIGS. 2A to 2C illustrate a process of manufacturing a VFET according to another exemplary embodiment.
Figure 2B:
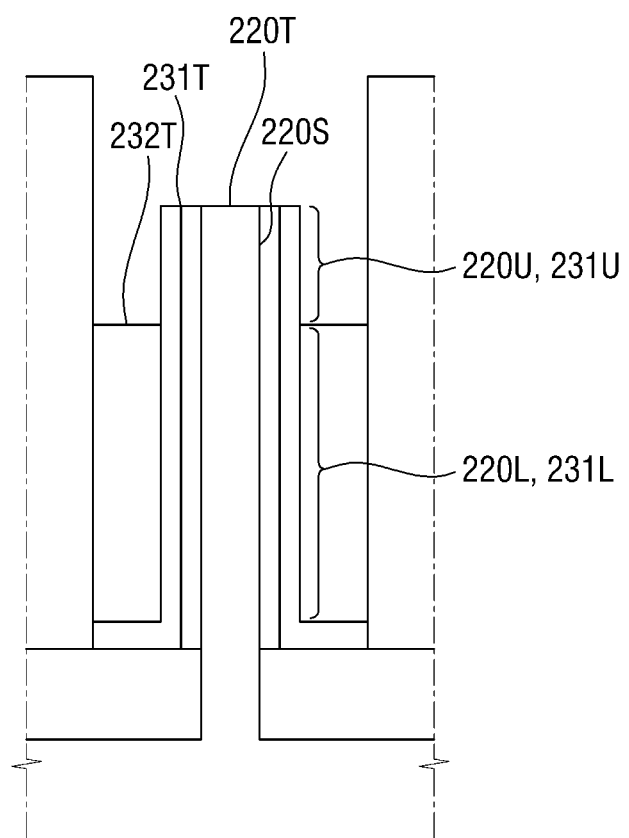
Figure 2C:
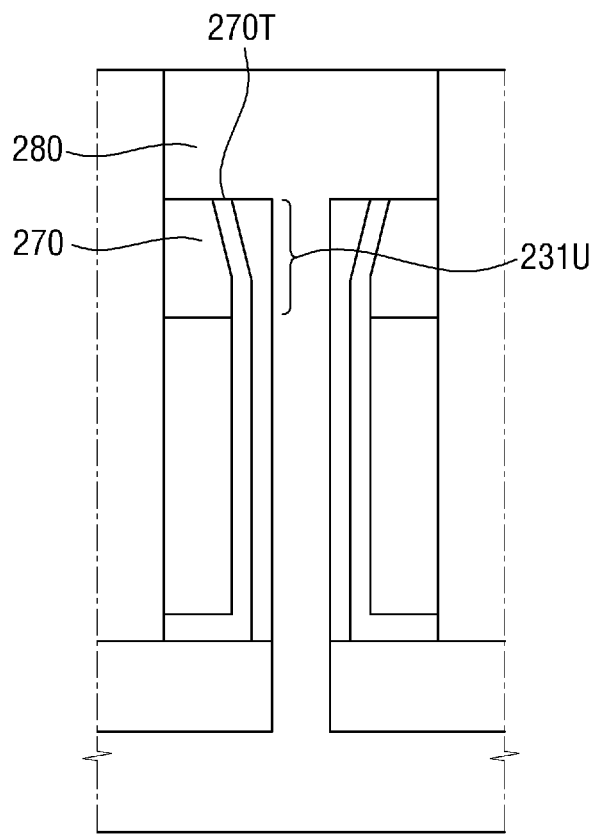

FIGS. 2A to 2C illustrate a process of manufacturing a VFET according to another exemplary embodiment.

Similar to the previous embodiment, the present embodiment begins with providing a semiconductor stack 200 shown in FIG. 2A through a CMP operation, not being limited thereto, for further processing to complete a VFET. The semiconductor stack 200 includes a bottom S/D region 210, a fin structure 220, a gate structure 230 including a gate dielectric layer 231 and a conductor layer 232, where the gate dielectric layer 232 is formed of at least an interfacial layer 231-1 and a high-κ dielectric layer 231-2. The semiconductor stack 200 further includes an interlayer 240, a mask layer 250, and a bottom spacer 260. Since the materials, structures, and functions of the above elements included in the semiconductor stack 200 may be the same as those included in the semiconductor stack 100, duplicate descriptions thereabout are omitted.

However, etching and top spacer forming operations described below in reference to FIGS. 2B and 2C differ from those described in reference to FIGS. 1B and 1C.

Referring to FIG. 2B, after the semiconductor stack 200 shown in FIG. 2A is provided, an etching operation is performed on the semiconductor stack 200 to remove the mask layer 250 and portions of the gate structure 230. Here, the gate structure 230 is etched such that portions of the gate dielectric layer 231 and the conductor layer 232 are removed by different depths from a top surface of the gate structure 230 shown in FIG. 2A. In other words, the gate dielectric layer 231 is etched by a less depth than the conductor layer 232, or the conductor layer 232 is etched by a greater depth than the gate dielectric layer 231 so that, after the etching operations, a portion of the gate dielectric layer 231 of a certain vertical length (referred to as "an upper portion 231U of the gate dielectric layer 231" herebelow) above a plane where a top surface 232T of the conductor layer 232 is positioned still remains on a sidewall 220S of the fin structure 220 at an upper portion 220U thereof. Thus, the upper portion 220U of the fin structure 220 along with the upper portion 231U of the gate dielectric layer 231 take a form of protrusion from the plane where the top surface 232T of the conductor layer 232 is positioned between the interlayers 240. Further, by this etching operation, a top surface 231T of the gate dielectric layer 231 is positioned higher than the top surface 232T of the conductor layer 232, and is coplanar or substantially coplanar with a top surface 220T of the fin structure 220.

Accordingly, the upper portion 231U of the gate dielectric layer 231, where the EOT described in the previous embodiment is likely to increase laterally, including a portion where the EOT is likely to be the greatest, due to oxidation or reoxidation, remains above the plane where the top surface 232T of the conductor layer 232 is positioned. That is, at a side of the upper portion 231U of the gate dielectric layer 231, no portion of the conductor layer 232 is positioned. Thus, even if the EOT increase occurs at the upper portion 231U of the gate dielectric layer 231, the gate dielectric layer 231 at a lower portion 231L, where the EOT increase does not occur, positioned below the plane where the top surface 232T of the conductor layer 232 is positioned, may maintain a uniformly thin or substantially uniformly thin lateral thickness along the sidewall 220S of the fin structure 220, thereby not adversely affecting gate controllability.

The etching operation of the present embodiment may also be performed by the same wet etching performed in the previous embodiment as shown in FIG. 1B. Thus, duplicate descriptions thereabout are omitted.

After the etching operation shown in FIG. 2B, a top spacer 270 and a top S/D region 280 is formed to complete the VFET, as shown in FIG. 2C. Since the materials, structures, and functions of the top spacer 270 and the top S/D region 280 may be the same as described above in reference to FIG. 1C, duplicate descriptions thereabout are omitted.

However, unlike the previous embodiment shown in FIG. 1C in which a bottom surface of the top spacer 170 contacts an entirety of the top surface 130T of the gate structure 130 including the gate dielectric layer 131 and the conductor layer 132, the top spacer 270 of the present embodiment is formed such that a bottom surface of the top spacer 270 of the VFET contacts only the top surface 232T of the conductor layer 232 in the gate structure 230. Further, according to the present embodiment, a top surface 270T of the top spacer 270 is coplanar or substantially coplanar with the top surface 231T of the gate dielectric layer 231 including the interfacial layer 231-1 and the high-κ dielectric layer 231-2.

Thus, even if the EOT increases at the upper portion 231U of the gate dielectric layer 231, the upper portion 231U of the gate dielectric layer 231, where the EOT is increased is positioned vertically inside the top spacer 270 where the conductor layer 232 is not formed at a side of the gate dielectric layer 231, and the lateral thicknesses of the lower portion 231L of the gate dielectric layer 231 and the conductor layer 232 which are positioned vertically outside the top spacer 270 do not change or substantially change along the lower portion 220L of the fin structure 220.

Accordingly, the etching operation and subsequent operations of forming the top spacer 270 according to the present embodiment may be able to form an improved VFET by preventing performance degradation of the gate structure 230 which may occur in the previous embodiment.

Meanwhile, the amount of the upper portion 231U of the gate dielectric layer 231 which is to remain after the etching operation of FIG. 2B may be determined such that the vertical length of the upper portion 231U of the gate dielectric layer 231 where the EOT increases to degrade the performance of the gate structure 230 can be smaller than or equal to the vertical thickness of the top spacer 270.

Figure 3A:
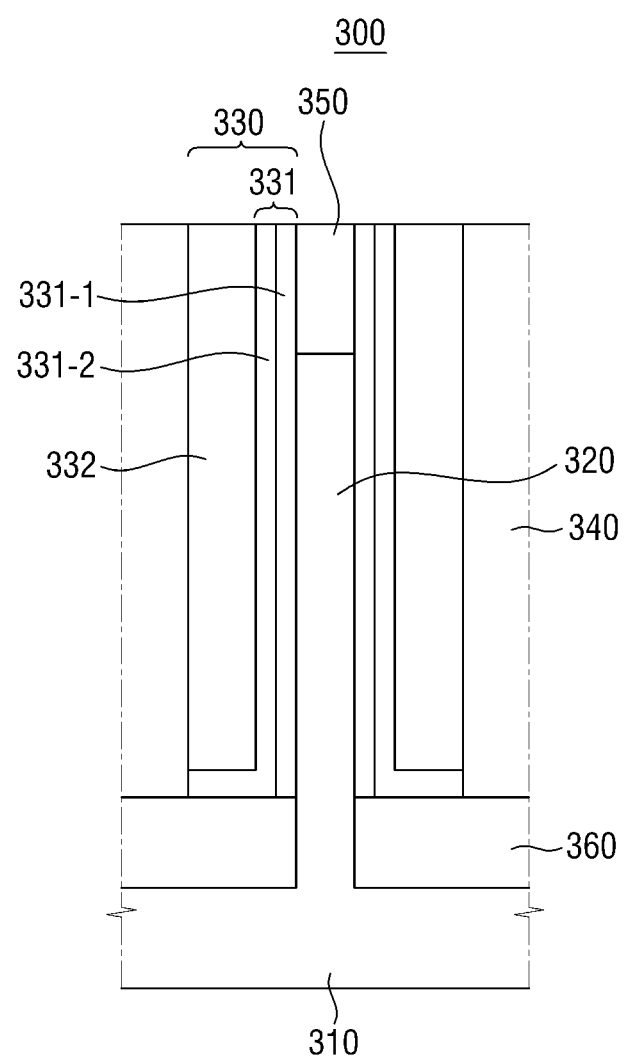
FIGS. 3A to 3C illustrate a process of manufacturing a VFET according to still another exemplary embodiment.
Figure 3B:
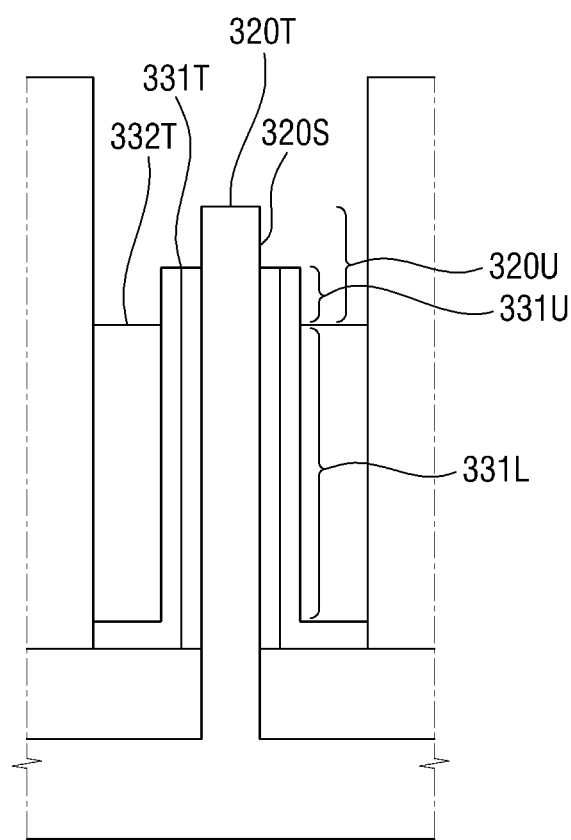
Figure 3C:
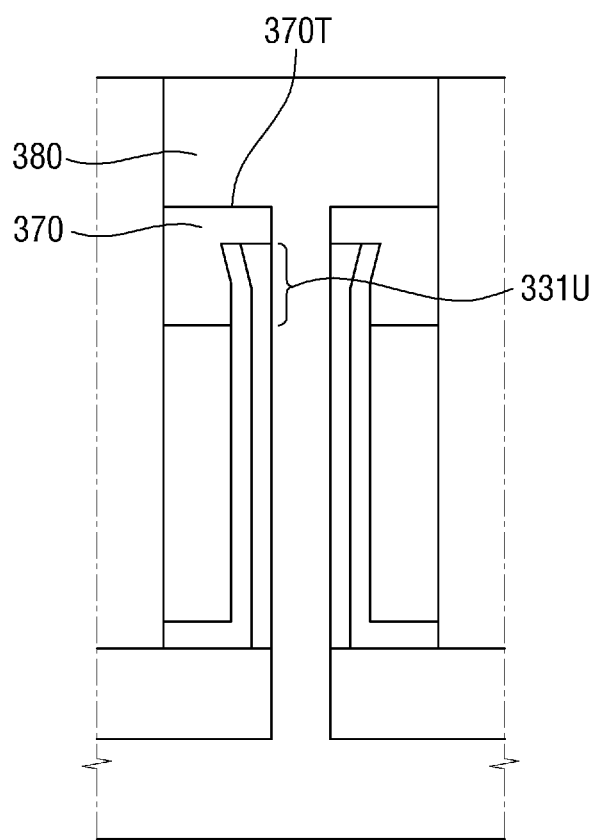

FIGS. 3A to 3C illustrate a process of manufacturing a VFET according to still another exemplary embodiment.

Similar to the previous embodiments, the present embodiment begins with providing a semiconductor stack 300 shown in FIG. 3A through a CMP operation, not being limited thereto, for further processing to complete a VFET. The semiconductor stack 300 includes a bottom S/D region 310, a fin structure 320, a gate structure 330 including a gate dielectric layer 331 and a conductor layer 332, where the gate dielectric layer 332 is formed of at least an interfacial layer 331-1 and a high-κ dielectric layer 331-2. The semiconductor stack 300 further includes an interlayer 340, a mask layer 350, and a bottom spacer 360. Since the materials, structures, and functions of the above elements included in the semiconductor stack 300 may be the same as those included in the semiconductor stacks 100 and 200, duplicate descriptions thereabout are omitted.

However, etching and top spacer forming operations described below in reference to FIGS. 3B and 3C differ from those described in reference to FIGS. 1B, 1C, 2B and 2C.

Referring to FIG. 3B, after the semiconductor stack 300 shown in FIG. 3A is provided, an etching operation is performed on the semiconductor stack 300 to remove the mask layer 350 and portions of the gate structure 330. Here, the gate structure 330 is etched such that portions of the gate dielectric layer 331 and the conductor layer 332 are removed by different depths from a top surface of the gate structure 330 shown in FIG. 3A. In other words, the gate dielectric layer 331 is etched by a less depth than the conductor layer 332, or the conductor layer 332 is etched by a greater depth than the gate dielectric layer 331 so that, after the etching operation, a portion of the gate dielectric layer 331 of a certain vertical length (referred to as "an upper portion 331U of the gate dielectric layer 331" herebelow) above a plane where a top surface 332T of the conductor layer 332 is positioned still remains on a sidewall 320S of the fin structure 320 at an upper portion 320U thereof. Thus, the upper portion 320U of the fin structure 320 along with the upper portion 331U of the gate dielectric layer 331 take a form of protrusion from the plane where the top surface 332T of the conductor layer 332 is positioned between the interlayers 340.

However, the etching operation according to the present embodiment shown in FIG. 3B differs from the previous embodiment of FIG. 2B in that the amount of the upper portion 331U of the gate dielectric layer 331 remaining by the etching operation on the semiconductor stack 300 is smaller than that of the upper portion 231U of the gate dielectric layer 231 remaining after the etching operation in the previous embodiment. That is, the vertical length of the upper portion 331U of the gate dielectric layer 331 is smaller than that of the upper portion 320U of the fin structure 320 which takes a form of protrusion from the plane where the top surface 332T of the conductor layer 332 is positioned, and the top surface 332T of the conductor layer 332 is formed to be lower than a top surface 320T of the fin structure 320.

Still, however, the purpose and result of the etching operation of FIG. 3B may be the same as those of FIG. 2B. In other words, the upper portion 331U of the gate dielectric layer 331, where the EOT is likely to increase laterally, including a portion where the EOT is likely to be the greatest, due to oxidation or reoxidation, remains above the plane where the top surface 332T of the conductor layer 332 is positioned. That is, at a side of the upper portion 331U of the gate dielectric layer 331, no portion of the conductor layer 332 is positioned. Thus, even if the EOT increase occurs at the upper portion 331U of the gate dielectric layer 331, the gate dielectric layer 331 at a lower portion 331L, where the EOT increase does not occur, positioned below the plane where the top surface 332T of the conductor layer 332 is positioned, may maintain a uniformly thin or substantially uniformly thin lateral thickness along the sidewall 320S of the fin structure 320, thereby not adversely affecting gate controllability.

The etching operation of the present embodiment may also be performed by the same wet etching performed in the previous embodiment as shown in FIGS. 1B and 2B. Thus, duplicate descriptions thereabout are omitted.

After the etching operation shown in FIG. 3B, a top spacer 370 and a top S/D region 380 is formed to complete the VFET, as shown in FIG. 3C. Since the materials, structures, and functions of the top spacer 370 and the top S/D region 380 may be the same as described above in reference to FIGS. 1C and 2C, duplicate descriptions thereabout are omitted.

The operation of forming the top spacer 370 according to the present embodiment shown in FIG. 3C is similar to that performed in the previous embodiment shown in FIG. 2C in that a bottom surface of the top spacer 370 of the VFET contacts only the top surface 332T of the conductor layer 332 in the gate structure 330.

However, unlike the previous embodiment shown in FIG. 2C in which the top surface 270T of the top spacer 270 is coplanar or substantially coplanar with the top surface 231T of the gate dielectric layer 231, the top spacer 370 of the present embodiment is formed such that a top surface 370T of the top spacer 370 is positioned higher than a top surface 331T of the gate dielectric layer 331 including the interfacial layer 331-1 and the high-κ dielectric layer 331-2.

Thus, even if the EOT increases at the upper portion 331U of the gate dielectric layer 331, the upper portion 331U of the gate dielectric layer 331, where the EOT is increased is positioned vertically inside the top spacer 370 where the conductor layer 332 is not formed, and the lateral thicknesses of the lower portion 331L of the gate dielectric layer 331 and the conductor layer 332 positioned vertically outside the top spacer 370 do not change or substantially change along the lower portion 320L of the fin structure 320.

Accordingly, the etching operation and subsequent operations of forming the top spacer 370 according to the present embodiment may also be able to form an improved VFET by preventing performance degradation of the gate structure 330 which may occur in the previous embodiment shown in FIGS. 1A to 1C.

Meanwhile, the amount of the upper portion 331U of the gate dielectric layer 331 which is to remain after the etching operation of FIG. 3B may be determined such that the vertical length of the upper portion 331U of the gate dielectric layer 331 where the EOT increases to degrade the performance of the gate structure 330 can be smaller than the vertical thickness of the top spacer 370.

Figure 4A:
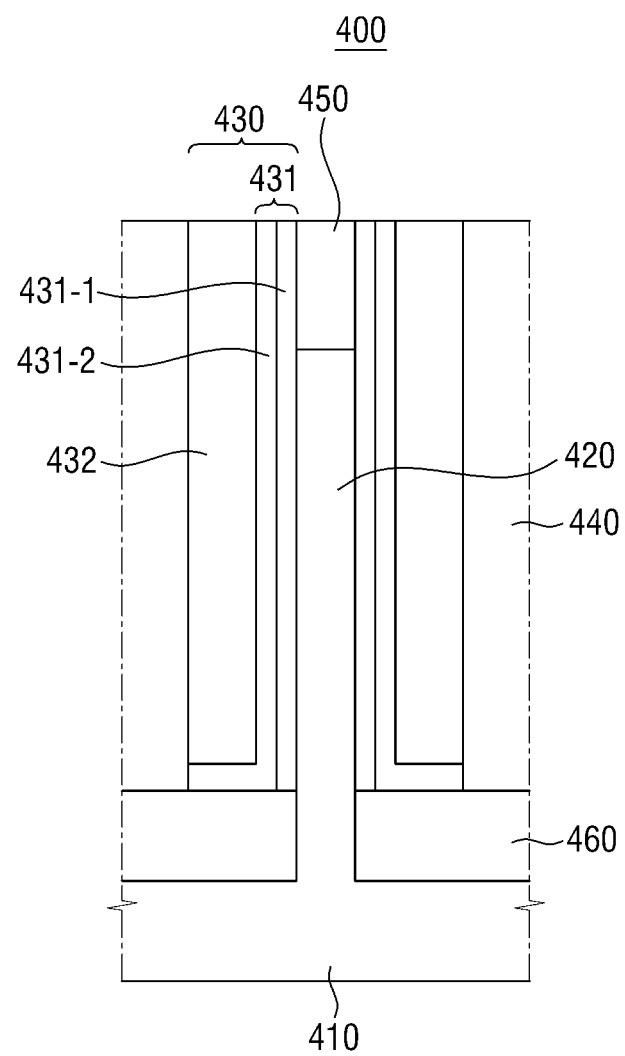
FIGS. 4A to 4C illustrate a process of manufacturing a VFET according to yet another exemplary embodiment.
Figure 4B:
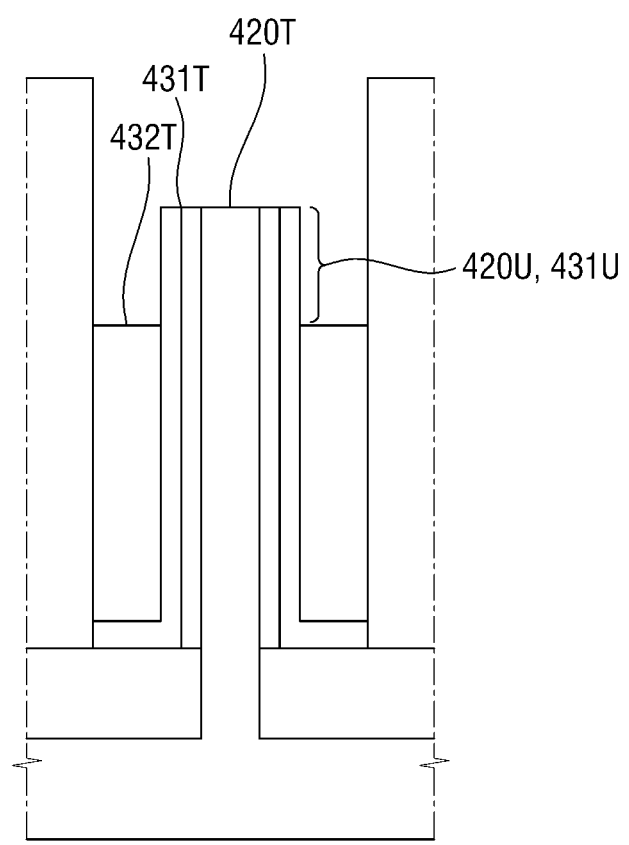
Figure 4C:
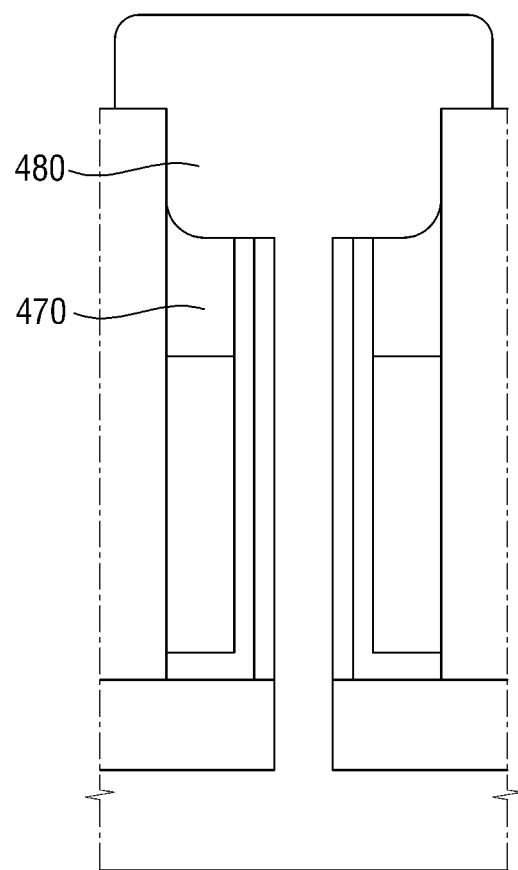

FIGS. 4A to 4C illustrate a process of manufacturing a VFET according to yet another exemplary embodiment.

Similar to the previous embodiments, the present embodiment begins with providing a semiconductor stack 300 shown in FIG. 4A through a CMP operation, not being limited thereto, for further processing to complete a VFET. The semiconductor stack 400 includes a bottom S/D region 410, a fin structure 420, a gate structure 430 including a gate dielectric layer 431 and a conductor layer 432, where the gate dielectric layer 432 is formed of at least an interfacial layer 431-1 and a high-κ dielectric layer 431-2. The semiconductor stack 400 further includes an interlayer 440, a mask layer 450, and a bottom spacer 460. Since the materials, structures, and functions of the above elements included in the semiconductor stack 400 may be the same as those included in the semiconductor stacks 100 to 300, duplicate descriptions thereabout are omitted.

Further, an etching operation of the present embodiment shown in FIG. 4B is similar to that of the previous embodiment shown in FIG. 2B. That is, an etching operation is performed on the semiconductor stack 400 to remove the gate dielectric layer 431 and the conductor layer 432, by different depths from a top surface of the gate structure 430, and the mask layer 450, by which an upper portion 420U of the fin structure 420 and an upper portion 431U of the gate dielectric layer 431 formed along the upper portion 420U of the fin structure 420 take a form of protrusion from a plane where a top surface 432T of the conductor layer 432 is positioned between the interlayers 440. After this etching operation, a top surface 431T of the gate dielectric layer 431 is coplanar or substantially coplanar with a top surface 420T of the fin structure 420.

Next, referring to FIG. 4C, an epitaxy 480 is grown on the top surface 420T of the fin structure 420 in the state where the fin structure 420 is laterally enclosed by the gate dielectric layer 431, whereby the epitaxy 480 is grown in an upward direction and extend to an upper portion of the interlayer 440 to form an air gap spacer 470 below the epitaxy 480 and above the conductor layer 432 and between the gate dielectric layer 431 and the interlayer 440. Here, the air gap spacer 470 may function of sealing the high-κ dielectric layer 431-2 as a top spacer of the VFET in the present embodiment. The epitaxy 480 may be a semiconductor epitaxy formed of formed of a material such as silicon (Si), germanium (Ge), silicon germanium (SiGe), and/or a silicon-containing material, not being limited thereto. Later, the epitaxy 480 is to be doped by one or more dopants to form a top S/D region in a following operation (not shown).

Since the growth of the epitaxy 480 generates the air gap spacer 470 at a side of the gate dielectric layer 431 and above the conductor layer 432 instead of a top spacer having a dielectric constant greater than air, possible parasitic capacitance occurring between a top S/D region, a top spacer and a gate structure may be reduced, thereby improving performance of a VFET formed by the present embodiment.

The foregoing is illustrative of exemplary embodiments and is not to be construed as limiting thereof. Although a few exemplary embodiments have been described, those skilled in the art will readily appreciate that many modifications are possible in the above embodiments without materially departing from the inventive concept.

What is claimed is:

1. A method for manufacturing a vertical field effect transistor (VFET), the method comprising:
    providing a stack of a bottom source/drain region, a fin structure, and a gate structure on a side wall of the fin structure, an interlayer on a sidewall of the gate structure, and a mask layer on the fin structure, the stack further comprising a bottom spacer on the bottom source/drain region and below the gate structure and the interlayer, and the gate structure comprising a gate dielectric layer on a sidewall of the fin structure and a conductor layer on the gate dielectric layer;
    etching the stack from a top surface thereof to remove the gate dielectric layer and the conductor layer, by different depths from the top surface thereof, and the mask layer such that an upper portion of the gate dielectric layer is positioned above a plane where a top surface of the conductor layer is positioned; and
    forming a top source/drain region on a top surface of the fin structure, a top surface of the gate structure and a sidewall of the interlayer.

2. The method of claim 1, further comprising forming a top spacer at least on the conductor layer and between a sidewall of the upper portion of the gate dielectric layer and the sidewall of the interlayer.

3. The method of claim 2, wherein the top surface of the gate dielectric layer is positioned at the same or substantially same level as, or positioned lower than a level of a top surface of the top spacer.

4. The method of claim 2, wherein the top spacer is formed of a material having a dielectric constant value less than 3.5.

5. The method of claim 2, wherein the top spacer is further formed on the top surface of the gate dielectric layer so that the top surface of the gate dielectric layer is positioned lower than the top surface of the top spacer, and higher than the top surface of the conductor layer.

6. The method of claim 2, wherein the upper portion of the gate dielectric layer, on which the top spacer is formed, is laterally thicker than a lower portion of the gate dielectric layer having a uniform or substantially uniform lateral thickness along the lower portion of the sidewall of the fin structure.

7. The method of claim 6, wherein the lateral thickness being greater at the upper portion of the gate dielectric layer is caused by at least oxidation on the gate dielectric layer.

8. The method of claim 2, wherein the gate dielectric layer comprises:
    an interfacial layer conformally formed on the sidewall of the fin structure; and
    a high-κ dielectric layer conformally formed on the interfacial layer except at a position where the high-κ dielectric layer is extendedly formed on a top surface of the bottom spacer.

9. The method of claim 8, wherein the interfacial layer comprises at least one of silicon oxide (SiO), silicon dioxide ($SiO_2$), and silicon nitride (SiON), and
    wherein the high-κ dielectric layer has a dielectric constant value greater than 7 and comprises a metal oxide of or a metal silicate of Hf, Al, Zr, La, Mg, Ba, Ti, Pb, or a combination thereof.

10. The method of claim 9, wherein the high-κ dielectric layer has the dielectric constant value greater than 15, and comprises at least one of $HfO_2$ and HfSiON.

11. The method of claim 2, wherein the top surface of the gate dielectric layer is positioned at the same or at the substantially same level as a top surface of the fin structure, and
wherein the forming the top source/drain region comprises growing an epitaxy from above the top surface of the fin structure to extend upwardly and toward the interlayer such that an air gap spacer is formed as the top spacer below the epitaxy, above the conductor layer, and between the interlayer and the gate dielectric layer.

12. A method for manufacturing a vertical field effect transistor (VFET), the method comprising:
providing a stack of a bottom source/drain region, a fin structure on the bottom source/drain region, and a gate structure on a side wall of the fin structure, the stack further comprising a bottom spacer between the bottom source/drain region and the gate structure, and the gate structure comprising a gate dielectric layer and a conductor layer sequentially stacked on a sidewall of the fin structure;
etching the stack from a top surface thereof to remove the gate dielectric layer and the conductor layer, by different depths from the top surface thereof, such that an upper portion of the gate dielectric layer is positioned above a level where a top surface of the conductor layer is positioned, and such that the top surface of the conductor layer is exposed from the gate dielectric layer; and
forming a top source/drain region on the top surface of the fin structure.

13. The method of claim 12, wherein, after etching the stack, the upper portion of the gate dielectric layer is laterally thicker than a lower portion of the gate dielectric layer, on which the conductor layer is formed.

14. The method of claim 13, wherein a lateral thickness of the upper portion the gate dielectric layer increases in an upward direction from the lower portion of the gate dielectric layer.

15. The method of claim 13, wherein the lower portion of the gate dielectric layer has a uniform or substantially uniform lateral thickness along a lower portion of the sidewall of the fin structure.

16. The method of claim 12, further comprising forming a top spacer on the top surface of the conductor layer,
wherein the top source/drain region is formed on a top surface of the top spacer.

17. The method of claim 12, wherein the stack further comprises an interlayer on a sidewall of the gate structure, and
wherein the forming the top source/drain region comprises growing an epitaxy from above the top surface of the fin structure to extend upwardly and toward the interlayer such that an air gap spacer is formed between the fin structure and the interlayer and between the conductor layer and the top source/drain region.

18. A method for manufacturing a vertical field effect transistor (VFET), the method comprising:
providing a stack of a bottom source/drain region, a fin structure on the bottom source/drain region, and a gate structure on a side wall of the fin structure, the stack further comprising a bottom spacer between the bottom source/drain region and the gate structure, and the gate structure comprising a gate dielectric layer and a conductor layer sequentially stacked on a sidewall of the fin structure;
etching the stack from a top surface thereof to remove the gate dielectric layer and the conductor layer, by different depths from the top surface thereof, such that an upper portion of the gate dielectric layer is positioned above a level where a top surface of the conductor layer is positioned; and
forming a top source/drain region on the top surface of the fin structure,
wherein, after etching the stack, the upper portion of the gate dielectric layer is laterally thicker than a lower portion of the gate dielectric layer, on which the conductor layer is formed.

19. The method of claim 18, wherein a lateral thickness of the upper portion the gate dielectric layer increases in an upward direction from the lower portion of the gate dielectric layer.

20. The method of claim 18, wherein the lower portion of the gate dielectric layer has a uniform or substantially uniform lateral thickness along a lower portion of the sidewall of the fin structure.

* * * * *